United States Patent [19]

Harshavardhan et al.

[11] Patent Number: 5,420,102
[45] Date of Patent: May 30, 1995

[54] SUPERCONDUCTING FILMS ON ALKALINE EARTH FLUORIDE SUBSTRATE WITH MULTIPLE BUFFER LAYERS

[75] Inventors: Kolagani S. Harshavardhan, Greenbelt, Md.; Thirumalai Venkatesan, Washington, D.C.

[73] Assignee: Neocera, Inc., College Park, Md.

[21] Appl. No.: 283,719

[22] Filed: Aug. 1, 1994

Related U.S. Application Data

[63] Continuation of Ser. No. 30,733, Mar. 12, 1993, abandoned.

[51] Int. Cl.$^6$ .............................................. B32B 9/00
[52] U.S. Cl. ..................... 505/237; 505/239; 505/238; 428/688; 428/689; 428/700; 428/930
[58] Field of Search ............... 505/239, 238, 237, 236, 505/235, 234, 233, 220, 192, 193, 701702, 703, 704; 428/688, 930, 689

[56] References Cited

U.S. PATENT DOCUMENTS

| | | | |
|---|---|---|---|
| 4,810,318 | 3/1989 | Haisma | 156/153 |
| 5,159,413 | 10/1992 | Caviello et al. | 505/1 |
| 5,248,564 | 9/1993 | Ramesh | 428/688 |
| 5,252,551 | 10/1993 | Wu et al. | 428/688 |

OTHER PUBLICATIONS

Sahu et al. "Overview of High T. Superconductivity," ACS, 1988 in Chemistry of High T Superconductors II chapter 1.
Tanimura et al., Jap Journ. of App. Phys. vol. 32 (1993) Feb. 15, 1993, L254–L256.
Wang et al., Appl. Phys. Lett. 59(12) Sep. 16, 1991, pp. 1509–1511.
Grant et al., Physica C 185–189 (1991) pp. 2099–2100.
"Cuprate Superconductors, Record 133 K Achieved with Mercury", C&EN, May 10, 1993, pp. 4–5.
Gebelle, Science, vol. 259, Mar. 12, 1993 pp. 1550–1551.
"Epitaxial MgO on GaAs(111) as a Buffer Layer for Z-Cut Epitaxial Lithium Niobate", Appl. Phys. Lett. 63(8), Aug. 23, 1993, pp.1029–1031, D. K. Fork, et al.
"Low-Temperature Growth of MgO by Molecular-Beam Epitaxy", The American Physical Society, Physical Review B, vol. 41, No. 11, Apr. 15, 1990, pp. 7961–7963, S. Yadavalli, et al.
"Reproductible Growth of High Quality $YBa_2Cu_3O_{7-x}$ Film on (100) MgO with a $SrTiO_3$ Buffer Layer by Pulsed Laser Deposition", APL 60 (25), Jun. 22, 1992, 3 pp., Jeffrey T. Cheung, et al.
"Large-Area $YBa_2Cu_3O_{7-\delta}$ Thin Films on Sapphire for Microwave Applications", Appl. Phys. Lett. 61(14), Oct. 5, 1992, pp. 1727–1729, B. F. Cole, et al.
"Epitaxial MgO on Si(001) for Y–Ba–Cu–O Thin–Film Growth by Pulsed Laser Deposition", Appl. Phys. Lett. 58 (20), May 20, 1991, pp. 2294–2296, D. K. Fork, et al.
"High Misfit Epitaxial Growth: Superconducting $YBa_2Cu_3O_{7-x}$ Thin Films on (100) $BaF_2$ Substrates", Appl. Phys. Lett. 59 (12), Sep. 16, 1991, pp. 1509–1511, S. Z. Wang, et al.
"Application of a Near Coincidence Site Lattice Theory to the Orientations of $YBa_2Cu_3O_{7-x}$ Grains on (001) MgO Substrates", Appl. Phys. Lett. 57 (16), Oct. 15, 1990, D. M. Hwang, et al.
"Defect Structure of Laser Deposited Y–Ba–Cu–O Thin Films on Single Crystal MgO Substrate", J. Mater. Res., vol. 5, No.4, Apr., 1990, pp. 704–716, R. Ramesh, et al.

(List continued on next page.)

*Primary Examiner*—Patrick J. Ryan
*Assistant Examiner*—Patrick R. Jewik
*Attorney, Agent, or Firm*—Morton J. Rosenberg; David I. Klein

[57] ABSTRACT

A high frequency superconducting device structure is disclosed which comprises an alkaline earth fluoride substrate with a magnesium oxide lower buffer layer on the alkaline earth substrate and an upper buffer layer epitaxial template layer on the magnesium oxide layer for providing a template for epitaxial growth of a high temperature superconducting film on the upper buffer layer, providing reduced dielectric and conducting losses at high frequencies. The disclosed structure may be incorporated into a multi-chip module (MCM) for providing very high speed interconnections.

12 Claims, 10 Drawing Sheets

OTHER PUBLICATIONS

"Interactions of $YBa_2Cu_3O_{7-x}$ Thin Films with Alkaline Earth Fluoride Substrates", J. Appl. Phys. 74 (5), Sep. 1, 1993, pp. 3194–3203, C. H. Peters, et al.

"$Y_1Ba_2Cu_3O_{7-x}$ Thin Films Grown on Sapphire with Epitaxial MgO Buffer Layers", Appl. Phys. Lett. 57 (1), Jul. 2, 1990, pp. 90–92, A. B. Berezin, et al.

"YBCO Thin Films on Sapphire with an Epitaxial MgO Buffer", 1991 IEEE, pp.970–973, A. B. Berezin, et al.

"Epitaxial Growth of $YBa_2Cu_3O_7$ Films on GaAs with MgO Buffer Layers", Appl. Phys. Lett. 61 (15), Oct. 12, 1992, pp. 1841–1842, W. Prusseit, et al.

"Epitaxial Growth of MgO on GaAs (001) for Growing Epitaxial $BaTiO_3$ Thin Films by Pulsed Laser Deposition", Appl. Phys. Lett. 60 (10), Mar. 9, 1992, pp. 1199–1201, Keiichi Nashimoto, et al.

Double Heterostructure GaAs/AlGaAs Thin Film Diode Lasers on Glass Substrates, E. Yablonovitch, E. Kapon, T. J. Gmitter, C. P. Yun, R. Bhat Reprinted from IEEE Photonics Technology Letters vol. 1, No.2, Feb. 1989.

Grafted GaAs Detetors on Lithium Niobate and Glass Optical Waveguides, A. Yi–Yan, W. K. Chan, T. J. Gmitter, L. T. Florez, J. L. Jackel, E. Yablonovitch, R. Bhat, J. P. Harbison, Reprinted from IEEE Photonics Technology Letters, vol. 1, No. 11, Nov. 1989.

Regrowth of GaAs Quantum Wells on GaAs Liftoff Films 'Van Der Waals Bonded to Silicon Substrates, E. Yablonovitch, K. Kash, T. J. Gmitter L. T. Florez, J. P. Harbison, E. Colas, Bellcore Navesink Research Center, Red Bank, N.J. 07701–7020, USA.

Epitaxial $CaF_2$ on GaAs (100 After Ambient Transfer with Arsenic Overlayer S. Sinharoy, Y. F. Lin, and J. H. Rieger, Westinghouse Research and Develop–Center, Pittsburg, Penna. 15235 (Received 8 Sep. 1986; accepted for publication 21 Oct. 1986).

Molecular Beam Epitaxial Growth of High Structural perfection CdTe on Si Using A $(Ca, Ba)F_2$ Buffer Layer, H. Zogg and S. Blunier, Swiss Federal Institute of Technology and AFIF–Ch–8093 Zurich, Switzerland (Received 2 Sep. 1986; accepted for publication 3 Oct. 1986).

A GaAs Misfet Using An MBE–Grown $CaF_2$ Gate Insulator Layer, Takao Waho and Fumihiko Yanagawa, Member IEEE.

Summary Abstrct: Growth of Epitaxial GaAs/Fluoride/GaAs (001) Structures P. W. Sullivan and J. E. Bower, Arthur D. Little, Inc. Cambridge, Mass. 02140 G. M. Metze, MIT Lincoln Lab., Lexington, Mass. 02173–0073 (Received 15 Sep. 1984; accepted 15 Oct. 1984).

Epitaxial Growth of Lanthanide Trifluorides by MBE, S. Sinharoy, R. A. Hoffman, J. H. Rieger, W. J. Takei, and R. F. C. Farow, Westinghouse R&D Center, Pittsburgh, Penna. 15235 (Received 15 Sep. 1984; accepted 15 Oct. 1984).

MBE–Grown Fluoride Films: A New Class of Epitaxial Dielectrics, R. F. C. Farrow, P. W. Sullivan, G. M. Williams, G. R. Jones, and D. C. Cameron, Royal Signals and Radar Establishment, St. Andrews Road, Malvern Worcs WR14 3PS UK (Received 27 Feb. 1981; accepted 18 May 1981).

Extreme Selectivity in the Lift-Off of Epitaxial GaAs Films, Eli Yablonovitch, T. Gmitter, J. P. Harbison and R. Bhat, Bell Communication Research, Navesink Research Center, Red Bank, N.J. 07701–7020 (Received 8 Sep. 1987; accepted for publication 21 Oct. 1987).

Van Der Waals Bonding of GaAs Epitaxial Liftoff Films Onto Arbitrary Substrates, E. Yablonovitch, D. M. Hwang, T. J. Gmitter, L. T. Florez and J. P. Harbison, Bell Communication Research, Navesink Research Center, Red Bank, N.J. 07701–7040 (Received 1 Dec. 1989; accepted for publication Red Bank, N.J. 07701–7040 (Received 1 Dec. 1989; accepted for publication 13 Apr.1990).

Feasibility of the High $T_c$ Superconducting Bolometer, P. L. Richards, J. Clarke, R. Leoni, Ph. Lerch and S. Vergheses, Dept. of Physics, Univ. of California, M. R. Beasley, T. H. Geballe, R. H. Hammond, P. Rosenthal, and S. R. Spielman, Dept. of Applied Physics, Stanford Univ. (Received 17 Oct. 1988; accepted for publication 15 Nov. 1988).

SUPERCONDUCTING FILMS ON ALKALINE EARTH FLUORIDE SUBSTRATE WITH MULTIPLE BUFFER LAYERS

This is a continuation of application Ser. No. 08/030,733 filed on 12 Mar. 1993, now abandoned.

BACKGROUND OF THE INVENTION

1. Field of the Invention

This invention generally relates to superconducting structures and their fabrication. In particular, this invention relates to low loss superconducting films on alkaline earth fluoride substrates.

The invention also generally relates to metal oxide structures. More particularly, this invention relates to a metal oxide film grown on a single crystalline silicon substrate with a buried oxide layer, and to free standing films formed therefrom.

This invention also generally relates to a substrate fixture assembly which is particularly useful for pulsed laser deposition. More particularly this invention relates to a substrate fixture providing simultaneous double sided coating and simultaneous multiple substrate coating.

2. Discussion of the Background

Low loss superconductive components can make vital contributions to current and future microwave and millimeter wave systems. There have been significant efforts to develop high temperature superconducting thin films (HTSC) for applications in the micro-wave components. The HTSC thin films used in typical micro-wave components must be deposited on a micro-wave compatible substrate having a low dielectric constant ($\epsilon$) and a low loss tangent in order to avoid unacceptable power dissipation in the substrate.

Of all the metal-oxide superconductors, thin films of $Y_1Ba_2Cu_3O_{7-x}$ for $x=0.5$ to $1.0$ (YBCO) are the most technologically advanced. State of the art YBCO films on $LaAlO_3$ substrates have achieved the best microwave performance. For example, pulsed laser deposition (PLD) deposited and patterned YBCO films on $LaAlO_3$ have shown surface resistance values lower than that of Cu by a factor of 20 at X-band (X-band spans 8-12 Ghz) and lower than that of Cu by more than two orders of magnitude at L-band (below 5 Ghz). However, $LaAlO_3$ has a dielectric constant ($\epsilon$) of 25.

While a variety of applications at the lower end of the micro-wave spectrum could be realized with current HTSC technology, satellite communications, radars and missile seekers all require higher frequencies in the millimeter wavelength region. In order for superconductor films to be useful at those higher frequencies substrate dielectric losses must be reduced, which requires a substrate with a low dielectric constant.

At high frequencies superconductors are not completely lossless. When a superconductor is used as a high frequency line to transport a signal, the resistive loss associated with that line decreases as the line width increases. Therefore, it is desirable to have relatively wide lines in order to reduce resistive loss. However, dielectric loss is proportional to the dielectric constant of a material and to the volume of dielectric material through which a high frequency electromagnetic wave is transported. Therefore, when the width of a superconducting line on a dielectric substrate is increased, the dielectric loss is also increased. Therefore it is useful to lower the dielectric constant of the dielectric material in which a superconducting line is formed in order to achieve to a superconducting waveguide which has the lowest possible high frequency loss.

A report prepared for the GE Astro Space Division by Belohoubek et al (Dec. 89) on "Applications of high $T_c$ superconductors for satellite communication systems" points out that even at the C-band frequencies (3.6-6.2 gigahertz) a low dielectric constant is important for a substrate because substrate dielectric loss becomes important for light weight, high performance filters. The relatively large dielectric constants of $LaAlO_3$ ($\epsilon=25$), Sapphire ($\epsilon=11$) and MgO ($\epsilon=9.5$) impose restrictions on the possible use of those substrates in conjunction with the high quality YBCO films, at least at millimeter wave frequencies. By a high quality HTSC film is meant an HTSC film which has a surface resistance at 10 gigahertz of less than 10 milli-ohms and preferably less than 1 milli-ohm.

Alkaline earth fluorides with the general formula $MF_2$ (where $M=Mg$, Ba, Sr, Ca) have static dielectric constants between 5 and 7 at liquid nitrogen temperatures (77K) and have been used as substrate material for YBCO films. However, YBCO films grown on $MF_2$ substrates have poor superconducting properties, such as the sharpness of the normal to superconducting transition and resistance versus temperature, as reported by P. Madakson et al. in Journal of Applied Physics, volume 63, No. 6, pp. 2046 (1988), and Siu-Wai Chan et al. in Applied Physics Letters, Volume 54, No. 20, pp 2032 (1989). Those YBCO films are also polycrystalline thereby introducing additional energy loss mechanisms at high frequency. Therefore those films are not suitable for micro-wave and millimeter-wave applications.

There have also been attempts to deposit YBCO films on top of a $CaF_2$ buffer layer buffering a GaAs substrate, as reported by K. Mizuno et al in Applied Physics Letters, Vol. 54, No. 4, pp. 383, (1989). The quality of those YBCO films is rather poor relative to the film quality when YBCO is deposited on high quality substrates such as $LaAlO_3$. There is a continuing need for superconducting thin films on substrates which provide lower energy loss at high frequencies than is now possible.

Another need is for improved infra-red (IR) detectors. It is known that superconducting films may be used for IR detectors. Low heat capacity substrates which have high thermal conductivity are desired for superconducting IR detectors in order to increase detector signal and speed. One substrate which has very high thermal conductivity is diamond. However high quality high $T_c$ films can not be deposited on diamond substrates due to lattice and thermal expansion mismatch and due to reaction of diamond with oxygen.

HTSC films have been deposited upon buffered reactive substrates by depositing a buffer layer on the reactive substrate prior to depositing an HTSC film. By a reactive substrate we mean any substrate upon which a thin film of a HTSC substantially interacts with the substrate so that the HTSC film is not superconducting or does not have a superconducting transition temperature or as high a critical current density within about a hundred angstroms of the interface between the HTSC film and the substrate.

In all the deposition schemes, there remains the difficulty of preparing a superconducting film which does not degrade due to its substrate and a substrate whose properties do not detract from the desired function of a superconducting device into which it is incorporated.

Many thin films have been deposited by PLD. During PLD, pulses of an ultraviolet laser are directed onto a target material. Each pulse vaporizes a small amount of the target surface. The vaporized material interacts with both the laser beam and target surface to create a dense plume of material rapidly travelling directly away from the target. A center of momentum of the plume is directed along the target surface normal so that a substrate surface is usually positioned opposing the target surface in order to block the plume. The plume impinges upon the substrate and deposits thereon to form a film. The material in the plume travels mainly directly away from the surface along the target surface normal. The plume also usually contains particles on the order of 1000 angstroms to 10 micron.

HTSCs such as $YBa_2Cu_3O_7$ are typically deposited onto single crystalline substrates held at a temperature between 600° and 850° C. Many applications require HTSC films deposited with a substrate surface temperature uniformity of ±5° C. for optimal growth of the desired phase. For single-sided coatings of substrates of diameter of less than 1 inch, substrates have been adhered to a hot plate with a high thermal conductivity paste in order to provide the desired temperature control. Radiative heaters have been used to heat the back sides of larger substrates, i.e., the side of the substrates that faces away from the target.

The large particles ejected from a target during PLD impinge upon and remain on the substrate. For many applications, those particulates are catastrophic. Also, for many technologically important applications, it is necessary to deposit buffer layers or create multilayer structures, which are degraded by the large particles in PLD films. Present substrate fixtures for PLD allow only single sided coating of substrates and are only suitable for coating a single substrate at a time. While such substrates are acceptable for research, they severely limit the commercial applications because of low throughput and the restriction of single side coating. Clearly PLD systems have several disadvantages limiting their usefulness for manufacturing thin film devices. A need exists to overcome all those disadvantages if PLD is to ever become commercially important.

Herein, perovskite crystal structure type material means any material which has the $CaTiO_3$ cubic crystal structure type or any of the tetragonal and rhombohedral or orthorhombic distortions of that cubic crystal structure type.

Herein, by epitaxial is generally meant that a layer grown on a single crystal substrate surface is also single crystal and has a particular crystallographic relationship to the substrate surface and that that crystallographic relationship is determined by the crystallography of the substrate surface and the material and deposition conditions of the grown layer. Particular crystallographic relationships either indicating alignment of crystallographic axes of a substrate with crystallographic axes of a film or alignment of crystallographic axes of substrate and film and also constraint of film lattice constants to be the same as lattice constants of the substrate at the film/substrate interface are disclosed for various interfaces throughout this application.

As indicated by the foregoing discussions, high temperature superconducting film technology has not progressed to a point enabling large scale integration of multiple functions on a single substrate.

SUMMARY OF THE INVENTION

Accordingly, it is an object of this invention to provide a superconducting thin film on a substrate which has superior microwave properties.

Another object of this invention is to provide an oxide superconductor thin film epitaxially grown on a $MF_2$ substrate which has reduced microwave loss.

Another object of the invention is to provide a free standing metal-oxide thin film having superior properties such as thickness uniformity, single crystal quality, and reduced thickness.

Another object of the invention is to provide a free-standing film of a superconducting material having the aforementioned properties.

Another object of the invention is to provide a free standing film bonded onto a different substrate from the substrate upon which it was grown.

Another object of the invention is to provide a novel substrate fixture for simultaneously heating multiple substrates and for allowing simultaneous coating on both sides of those substrates.

Another object of the invention is to provide a novel substrate fixture which provides coating uniformity by use of a flow through gas supply.

The present invention provides a novel high frequency device structure, comprising a single crystal (001) oriented $MF_2$ substrate, an oriented (100) MgO buffer layer on the substrate, a second buffer layer on the MgO layer and upon which high quality HTSC films can be grown, and a high quality oxide superconducting layer on and contacting the second buffer layer, and a process for forming that device structure. Preferably, the superconducting film is $YBa_2Cu_3O_{7-x}$ with x near zero and the substrate is magnesium fluoride.

The present invention provides a novel process for forming a novel free standing film by separating a film from a supporting structure, said structure and film comprising a silicon substrate with a buried oxide layer, buffer layers on the substrate, and a metal-oxide layer on the buffer layers, comprising forming said structure and selectively etching away at least the silicon substrate.

The present invention provides a novel substrate fixture comprising an enclosure having an enclosure first major surface opposing an enclosure second major surface, a substrate holder means for holding a substrate so that a flat substrate first major surface is opposing one of the enclosure first and second major surfaces and is between the enclosure first and second major surfaces, means for rotating the substrate holder means about an axis parallel to the normal to the substrate first major surface. The enclosure has an opening disposed to overlap a plane defined by the substrate first major surface. Preferably, the enclosure includes a heater to uniformly heat the substrate. Preferably, the holder means has means to simultaneously hold several parallel and closely spaced substrates.

DETAILED DESCRIPTION OF THE PREFERRED EMBODIMENTS

FIRST EMBODIMENT

Figure 1:
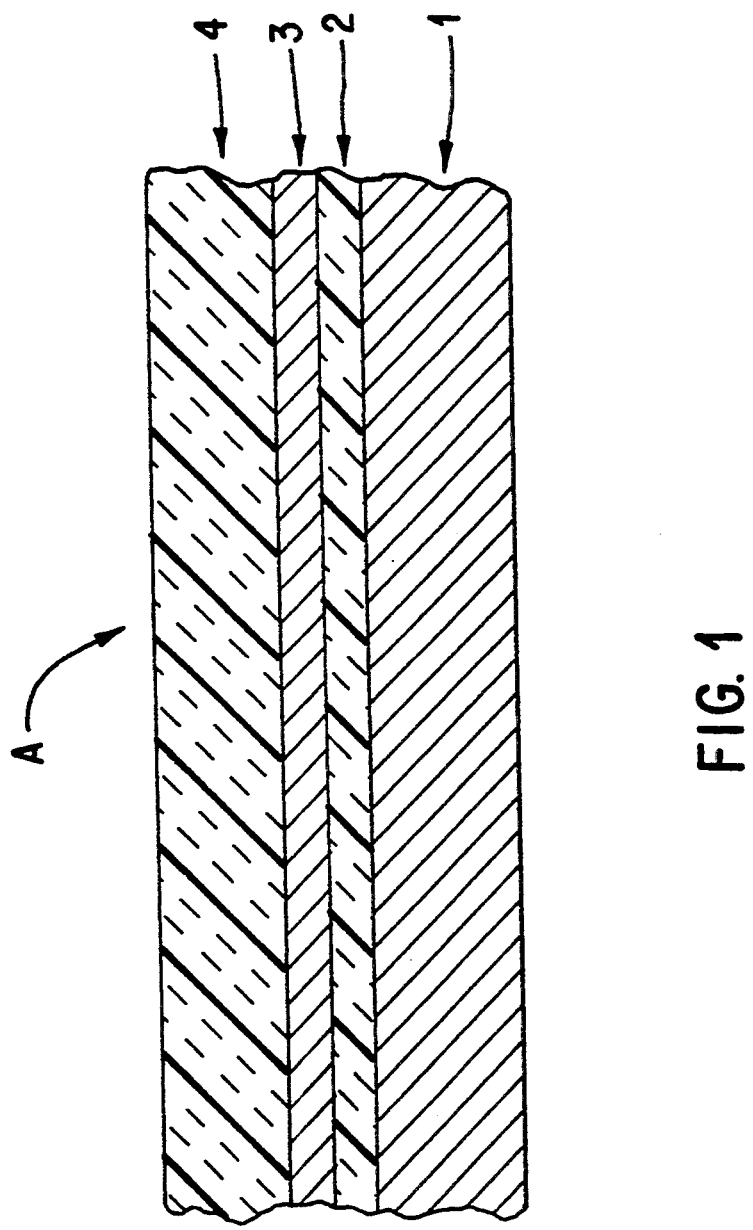
FIG. 1 shows a sectional view of a first embodiment of the invention.

A more complete appreciation of the invention and many of the attendant advantages thereof will be readily obtained as the same becomes better understood by reference to the following detailed description when considered in connection with the accompanying drawings, wherein FIG. 1 shows a layered structure A having substrate 1 of (001) oriented $MgF_2$. $MgF_2$ has a dielectric constant of 5.2 at 77K. Epitaxial MgO buffer layer 2, is deposited directly upon substrate 1 and is oriented (100). Thin film upper buffer layer 3, preferably of (100) oriented $NdGaO_3$, is grown on MgO buffer layer 2. Superconducting thin film 4 is grown on upper buffer layer 3.

Substrate 1 may be any alkaline earth fluoride substrate. Preferably, superconducting film 4 is YBCO, but it may be any of the HTSCs such as BiSrCaCuO and TlBaCaCuO superconductors and their analogues. Analogues means any of the materials having the same crystal structure as that of known superconducting compounds consisting of the sets of elements listed above, but in which at least one element has been partially or totally substituted by another chemically similar element and that chemically similar element resides at the lattice site of the removed element. Analogues also means those compounds in which certain of the elements listed in the sets of elements mentioned above have zero concentration, such as TlBaCuO compounds which have zero Ca content. The invention is not limited to any particular one of those HTSCS. However, higher quality films of YBCO than of the other known HTSCs can be fabricated at this time. YBCO analogues include compositions in which Y is substituted by any of the rare earths that are well known to form superconducting materials and/or lanthanum.

$MgF_2$, and the other alkaline earth fluorides are very chemically reactive with oxides at the growth temperatures and high oxygen partial pressures necessary for deposition of oxide high temperature superconductors. MgO buffer layer 2 is very unreactive and functions to chemically isolate substrate 1 from upper layers of layered structure A.

Single crystalline (100) oriented MgO thin films can be grown on alkaline earth fluoride substrates. Low growth temperature ensures that no MgO/substrate interdiffusion occurs during growth.

MgO buffer layer 2 is preferably grown at lower temperatures of less than 600° C. At temperatures of less than 600° C. the $MgF_2$ does not diffuse into MgO buffer layer 2 and MgO buffer layer 2 does not diffuse into the $MgF_2$. Mgo buffer layer 2 both isolates subsequent layers from substrate 1 and grows epitaxially on substrate 1 so that a (100) surface is presented to upper buffer layer 3.

Preferably, MgO buffer layer 2 is at least 30 angstroms thick so that it completely isolates substrate 1 from layers deposited upon Mgo buffer layer 2. Preferably, MgO buffer layer 2 is no more than one micron thick so that the dielectric loss properties of the MgO do not become considerable.

Upper buffer layer 3 is grown directly on MgO buffer layer 2 and functions to provide an epitaxial lattice match for growth of superconducting layer 4 so that superconducting layer 4 grows epitaxially upon upper buffer layer 3 and with minimal stress and minimal defects. Alternatively, upper buffer layer 3 may be grown on an intermediate buffer layer disposed between the MgO and upper buffer layer 3 in order to provide additional strain relief or lattice matching.

In a preferred embodiment, upper buffer layer 3 comprises a perovskite crystal structure type material, such as $NdGaO_3$, $LaGaO_3$, $LaAlO_3$, or $SrTiO_3$. Preferably, upper buffer layer 3 is greater than 50 angstroms thick, because that thickness allows lattice mismatch at the interface between the MgO buffer layer 2 and upper buffer layer 3 to not affect the upper surface of upper buffer layer 2, so that growth of superconducting film 4 is not affected by strain at the interface between the two buffer layers.

Preferably, the lattice mismatch between superconducting film 4 and upper buffer layer 3 is less than 6 percent. Lattice mismatch of less than 6 percent provides for relatively high quality HTSC films. For example, the lattice mismatch between the average of the a and b lattice constants of YBCO and the lattice constant of all four of the perovskites mentioned above is less than 3 percent. The a and b lattice constants of YBCO are 3.82 and 3.89 angstroms which are very close to one another. While perovskites are not always exactly cubic the variation of their lattice constants is usually very small and they are usually considered to be cubic and to have a single average lattice constant value, at least when used for HTSC substrates.

In a preferred embodiment upper buffer layer 3 comprises $NdGaO_3$ and superconducting film 4 comprises YBCO, because of the minimal lattice mismatch of less than 1 percent between the a and b axes of YBCO and the lattice constant of 3.83 angstroms of $NdGaO_3$. In this instance by epitaxial is meant that the a and b axes of superconducting film 4 align at the interface with cubic axes of the $NdGaO_3$ and that the lattice constants of superconducting film 4 at the interface with $NdGaO_3$ are constrained to the $NdGaO_3$ lattice constant. Defects in the interface structure of superconducting film 4 may occur to reduce stress.

Upper buffer layer 3 may also comprise $LaSrGaO_4$, $NdCaAlO_4$, or $LaSrAlO_4$ because those materials grow epitaxially on MgO and high quality HTSC films can be grown upon surfaces of those materials. In particular, epitaxial YBCO films can be grown upon those substrates. By epitaxial in this instance is meant that the YBCO films are oriented c axis out of the plane and have their a and b axes aligned with the a and b axes of upper buffer layer 3 or alternatively that the YBCO films are oriented c-axis in the plane of the film and have either their a or their b axis out of the plane.

Upper buffer layer 3 may also be $CeO_2$ which is cubic or yttria stabilized zirconia (YSZ) which is also cubic. YSZ contains about 9 mole percent of $Y_2O_3$ to stabilize the cubic phase. High quality epitaxial YBCO can be grown on those substrates. In this instance by epitaxial is meant that the YBCO has its c axes out of the plane and has its a and b axes in the plane, but rotated at 45 degrees relative to the a and b axes of upper buffer layer 3 or that the YBCO film is oriented c-axis in the plane with either its a or its b axes out of the plane and in which case the YBCO film c-axis in the plane and the a or b axis in the plane are canted at 45 degrees relative to the cubic axes of, in this case, cubic upper buffer layer 3.

Effective surface resistance, which is defined to be a thin film surface resistance value obtained assuming both substrate dielectric loss and superconducting film resistive loss are due only to film surface resistance, for layered structure A, has the same frequency dependence as the best oxide high temperature superconducting films so far obtained on any substrate when superconducting layer 4 is YBCO.

A large lattice mismatch of 8.8% exists between MgO (a 4.21 Å) and YBCO (a=3.82 Å, b=3.89 Å), and films of YBCO grown on MgO exhibit a polycrystalline mosaic microstructure. The orientational relationship between an MgO substrate and a YBCO film are established to be [110] YBCO parallel to (1001 MgO in the (a-b) plane of the film and (001) YBCO parallel to [001] MgO along the c-axis of the film. Further, in the resulting mosaic microstructure, the in-plane orientational relationship is different from one grain to another. The absence of complete a-b plane locking results in a c-axis oriented polycrystalline film in which the grain boundaries act as weak-links resulting in microwave losses.

YBCO films grown on substrates such as $SrTiO_3$ with a closer lattice match (a=3.9 Å) on the other hand exhibit a single crystalline microstructure with epitaxial relationships such as [100] YBCO parallel to [100] $SrTiO_3$ in the (a-b) plane of the film and [001] YBCO parallel to [001] $SrTiO_3$ along the c-axis of the film. $SrTiO_3$ used as upper buffer layer 3 mainly provides an ideal epitaxial structural template over the (100) MgO buffer layer 2, for growth of superconducting film 4 of YBCO.

$MgF_2$ is chemically reactive at the high growth temperatures (>750° C.) and high oxygen partial pressures (on the order of 250 mTorr) needed to obtain high quality YBCO films. Though it is possible to grow YBCO films directly on $MgF_2$ substrates at relatively lower temperatures in the vicinity of 650° C., the superconducting properties of films grown at those low temperatures are rather poor (with the transition temperatures around 80–83K). Even at the lower growth temperatures deposition of films on magnesium fluoride substrates lead to film-substrate reactions which poison properties of both the film and the $MgF_2$ substrate. Similar film-substrate reactions occur when YBCO films are grown on other alkaline earth fluoride substrates.

EXAMPLE 1

Prior to fabrication, the deposition vacuum chamber was pumped down to vacuum levels of the order of 104 Torr and then raised through introduction of oxygen in order to maintain the required oxygen partial pressure during deposition. All the three layers were deposited in a single pump-down cycle, without exposing the chamber to the ambient atmosphere between each layer. The targets were held on a carrousel of the sort described by Chase et al. in "Multilayer high $T_c$ film structures fabricated by pulsed laser deposition of Y—Ba—Cu—O", Journal of Materials Research, volume 4, 1989, pp. 1326–1329. During the depositions, the carrousel would rotate the chosen target about the target axis with the laser beam hitting the circumference of the target.

Between the depositions, the carrousel itself would rotate about its own axis to place the required target in the laser beam.

PLD was used to deposit an MgO buffer layer, a $SrTiO_3$ buffer layer and a YBCO film onto an $MgF_2$ substrate. PLD is well known. See for example, Singh et al. in "Theoretical model for deposition of superconducting thin films using pulsed laser evaporation technique", Journal of Applied Physics, volume 68, 1990, pp 233–246. A KrF excimer laser delivered optical pulses of 248 nm radiation with pulse widths of 20 ns, pulse energy densities of 1.5 $J/cm^2$ on stoichiometric targets, at pulse repetition rates of 10 Hz. A substrate holder/heater holding the substrate maintained the substrate at a temperature of 700° C. during deposition of YBCO and $SrTiO_3$ buffer layers, and at 600° during deposition of the MgO buffer layer.

The substrate onto which the films were deposited was 10 mm×10 mm and 0.5 mm thick, and is commercially available from Solon Technologies Inc. of Solon, Ohio.

The MgO layer was deposited to a thickness of 1000 Å in an oxygen partial pressure of 1 Mtorr at 600° C. The MgO target is commercially available from Canadian Substrate Supplies Ltd. of Niagara Falls, N.Y.

A 100 Å thick buffer layer of $SrTiO_3$ was deposited in an oxygen partial pressures of 250 mTorr onto a substrate maintained at 700° C. The target for deposition of the (100) $SrTiO_3$ buffer layer was a single crystal of stoichiometric composition from commercial Crystal Laboratories, Inc. of Naples, Fla.

The YBCO layer was deposited to a thickness of about 3000 Å. The target for the laser deposition of the YBCO layer was a pellet of sintered powder of YBCO and is available from Seattle Specialty Ceramics of Woodinville, Wash. After the depositions the film was cooled to room temperature at the rate of 75° C./min in 200 Torr of oxygen.

The superconducting transition temperature of the YBCO film was determined by ac susceptibility and dc resistivity measurements carried out as a function of temperature. The YBCO film of example 1 of the invention exhibited a superconducting transition temperature of 90K with a transition width less than 1K.

The critical current density of the YBCO film of example 1, $J_c$ at which superconductivity deteriorates (defined as the current density at which a voltage drop of 1 mV/mm is observed along the conduction direction) was estimated by I-V measurements using a 100 mm-wide and 2 mm long bridges. At 77K, and zero applied magnetic field, $J_c$ was $4 \times 10^6$ $A/cm^2$.

The crystalline quality of the film-buffer layer of Example 1 was determined by x-ray diffraction. The diffraction shows a high degree of crystalline quality and indicates that the c-axis of the YBCO film, both buffer layers, and the substrate all aligned parallel to each other, indicating a high degree of epitaxial growth.

The micro-wave/millimeter-wave properties of the YBCO film of Example 1 were measured using a dielectric resonator at 24 Ghz in which the top surface of the resonator was formed by the superconducting film. The films have unloaded Q values in excess of 30,000. That value indicates that the top surface resistance of films of example 1 are as low as the highest quality HTSC superconducting films.

COMPARATIVE EXAMPLE 1

A YBCO film was grown on the (001) $MgF_2$ substrate without any buffer layer at temperatures and pressures typically used as mentioned above. The film is non-superconducting at and above 77K.

COMPARATIVE EXAMPLE 2

A YBCO film was grown on a (001) $MgF_2$ substrate with a (100) MgO buffer layer. The film has a superconducting transition temperature of 83K. The transition width is about 2K. The structural quality of the film as studied by x-ray diffraction is rather poor (indicating polycrystalline material) and is therefore not suitable for micro-wave and millimeter-wave components.

YBCO film 4 grown on a (001) $MgF_2$ substrate with a first buffer layer of (100) MgO and a second buffer layer of (100) $SrTiO_3$ exhibits good crystallographic structure and excellent superconducting properties essential for applications in the micro-wave and millimeter-wave frequencies. The upper buffer layer promotes highly epitaxial YBCO film growth, and promotes growth of a YBCO film which does not have grain boundaries.

Multilayer structure A may be used as part of a high frequency resonator by forming a wall of the resonator from the superconducting film of multilayer A. Multilayer structure A may also be used as a transmission line for high frequency.

Although the invention has been described with reference to YBCO, almost all of the HTSC oxide superconductors have crystal structures with very similar a and b lattice constants so that they grow with the highest film quality and with the lowest surface resistance on the same substrates upon which YBCO grows best. Therefore this invention can be used with any of those HTSCs.

Although pulsed laser deposition was used in the disclosed examples, the invention may be practiced with all other deposition techniques, e.g., magnetron sputtering, or e-beam deposition.

Although the invention has been described with reference to (001) $MgF_2$ substrate, any of the alkaline fluoride materials may be used as the substrate. MgO is not reactive with the other alkaline earth fluorides and may be deposited upon those alkaline earth fluorides at low temperature.

The invention thus provides a superconducting layered structure which has superior superconducting properties and a low dielectric constant and low dielectric loss substrate. Therefore it can be advantageously used in low loss superconducting components in the microwave and millimeter-wave frequencies.

The invention described above is useful in multi-chip modules (MCMs) because it provides for very high band width and low dispersion interconnection lines between integrated circuit (IC) chips of a MCM. An MCM is defined to be a rigid structural member for structurally supporting a set of IC chips and which comprises conducting interconnection lines for electrically connecting the active electrical functions of those IC's so that they work together to provide intended functions. Superconducting film 4 provides a layer which may be patterned into signal lines for connecting the ICs of an MCM. Inclusion of a ground plane in substrate 1 then provides a very high band width transmission line comprising the ground plane and the signal lines formed from superconducting film 4 for interconnection of ICs of an MCM. As further discussed below, that ground plane may also be superconducting and multiple layers of signal lines may be present.

In FIG. 1 only a single superconducting layer 4 is disclosed. However, the invention embodied in FIG. 1 is also advantageous in devices in which there are a series of high quality superconducting layers, at least one of which is seperated from other conducting layers by a low dielectric loss insulator. Those superconducting layers may be used to provide power through a power supply layer, provide a ground plane through a ground plane layer for acting as the ground plane of a very high band width transmission line for a signal line layer for transporting signals at high frequencies.

There may be more than one superconducting signal line layer and more than one ground plane layer. The signal line layers may be sandwiched between ground plane layers, thereby forming signal line transmission line layers which are isolated from one another in order to allow large scale integration. The signal line layers act as interconnect layers for interconnecting active electronic components of a single electrical and structural electronic module.

In a preferred MCM embodiment of the present invention there are two signal line layers, an X layer and a Y layer, where X and Y indicate that lines formed from each one of those layers extend generally along one direction of the module and lines formed from the other layer extend along the perpendicular direction. The X and Y signal line layers are only seperated by a very thin and low dielectric constant dielectric so that most of the energy of a travelling wave resides in the very low dielectric constant $MF_2$ layer. Because superconducting signal lines may be much narrower than non-superconducting signal lines a single set of one X layer and one Y layer may replace a much larger number of normal metallic non-superconducting signal line layers. Obvious reductions in manufacturing and design costs and increases in operating speeds result.

Figure 1A:
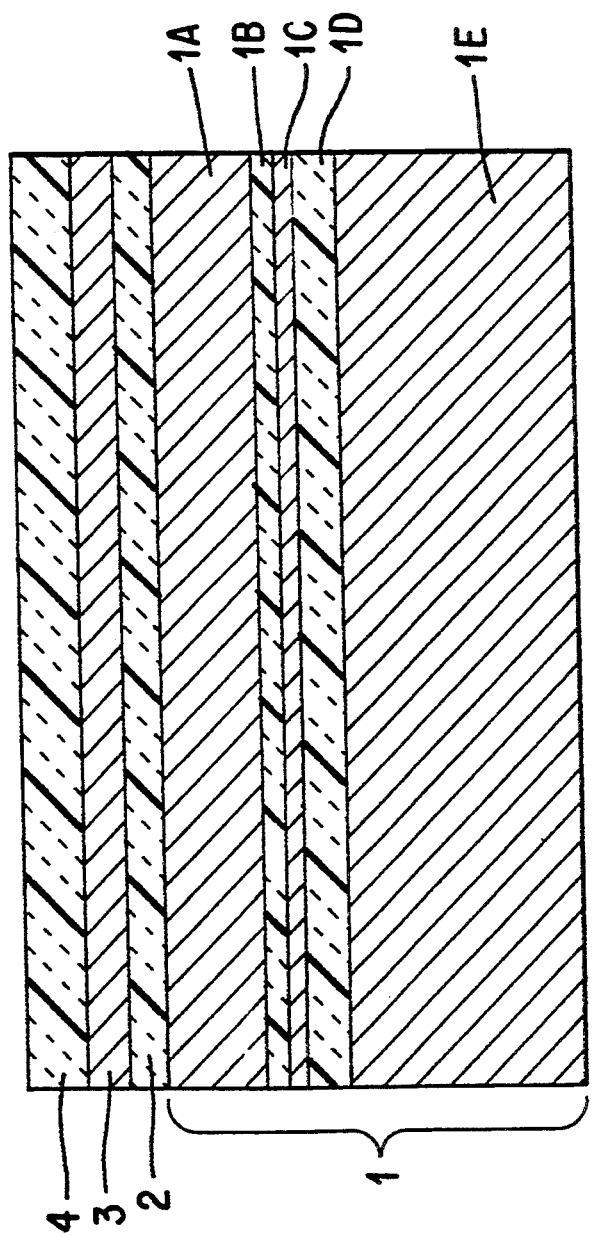
FIG. 1A shows a sectional view of a variation of the first embodiment of the invention.

FIG. 1A shows that type of structure in which substrate 1 is subdivided into a plurality of five layers, 1A, 1B, 1C, 1D and 1E. Layer 1E comprises a substrate layer upon which is grown superconducting metal oxide layer 1D. The surface of layer 1E upon which superconducting metal oxide layer 1D is grown should be a material which is compatible with growth of the superconducting oxide, such as $SrTiO_3$. Layer 1C is a lattice matching buffer layer which grows epitaxially upon the superconducting metal oxide layer 1D. For example, layer 1C may be $SrTiO_3$. Layer 1B is another superconducting metal oxide layer which grows epitaxially on lattice matching buffer layer 1C. Layer 1A is a alkaline earth fluoride layer upon which layer 2 shown in FIG. 1 is to be grown.

Superconducting layers 1D and 1B may be used as power supply layers and ground plane layers, respectively. Layer 1D is the power supply layer which is electrically isolated from pickup of high frequency signals occurring in high frequency lines above ground plane layer 1B because of the electrical isolation provided by ground plane layer 1B. High frequency signals may be transported via superconducting transmission lines formed by forming signal lines from superconducting layer 4 in which case the transmission line is defined to include superconducting ground plane line 1B, alkaline earth layer 1A and buffers layers 2 and 3.

Layer 1E may comprise additional superconductor layers for signal line layers and additional superconducting ground plane layers to isolate the superconducting signal line layers from one another. When more than one superconducting signal line layer exists those layers are preferably isolated from one another by superconducting ground plane layers to reduce line cross talk and reduce line dispersion.

As with conventional semiconductor multilevel technology, via holes may be used to provide interlayer contact. Ground plane layers may be replaced by conducting materials which are not metal-oxides and which are not superconducting since resistive losses associated with ground plane layers are relatively low.

SECOND EMBODIMENT

Figure 2:
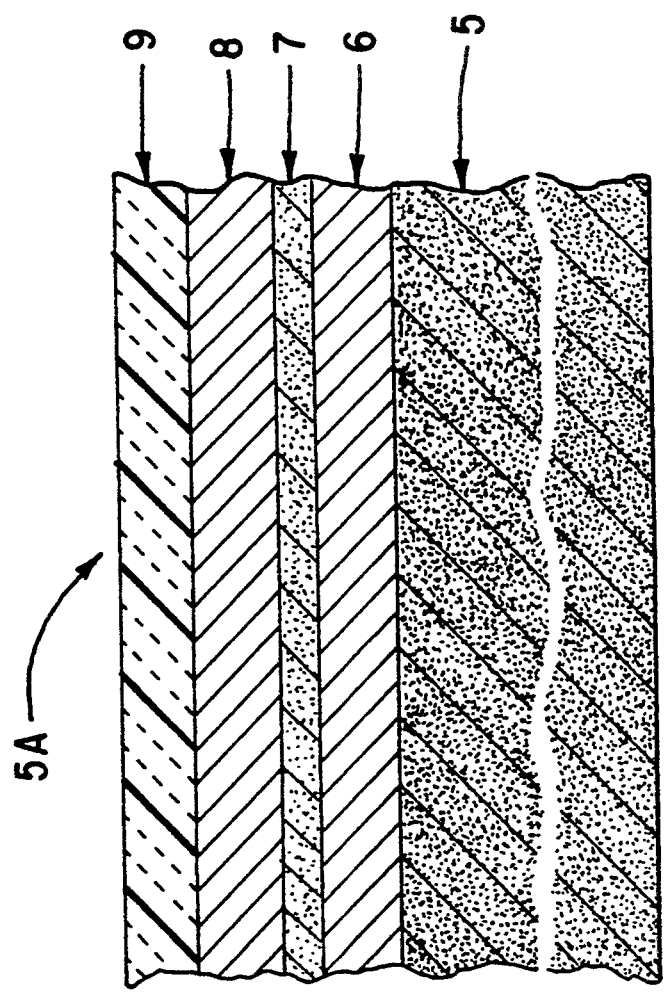
FIG. 2 shows a sectional view of a second embodiment.

A more complete appreciation of the second embodiment of the invention and many of the attendant advantages thereof will be readily obtained as the same becomes better understood by reference to the following detailed description of the second embodiment when considered in connection with the accompanying drawings, wherein FIG. 2 shows a cross section of a layered structure sa comprising single crystal silicon substrate 5, buried oxide layer 6, upper silicon layer 7 buffer layer 8 and metal oxide film 9.

Preferably silicon substrate 5 is oriented (100). Preferably, buried oxide layer 6 is buried at a depth of about 2000 Å beneath the substrate surface, i.e., beneath the upper surface of upper silicon layer 7.

Buried oxide refers to formation of a silicon oxide layer by implantation of oxygen into silicon and subsequent heating to form silicon oxide. During that subsequent heating the implanted oxide crystallizes with the adjacent silicon to form crystalline silicon oxide. The silicon oxide and adjacent upper silicon layer 7 phase separate and recrystallize during that process and form an atomically sharp interface; between them.

Ion implantation provides a suitable method for doping a single crystalline silicon substrate in a layered region beneath a major surface of the substrate. During implantation of oxygen into a silicon substrate no surface-phase layers are created and only desired buried oxide layers are formed. To activate oxygen atoms implanted into silicon and to remove implantation damage it is necessary to anneal a silicon substrate to a minimum temperature of 900° C. and that step is called solid phase epitaxy. During the step of solid state phase epitaxy, a buried oxide layer with well-controlled thickness is obtained leaving a thin, single crystal Si layer above and an annealed Si substrate below the buried oxide layer. The interfaces between the Si and buried oxide layer are atomically sharp. A more detailed description of the process, called the SIMOX process is described in a recent article by G. K. Celler and A. E. White in Materials Research Bulletin, June 1992. A wealth of information regarding silicon chemistry exists in the literature as found in an article by C. A. Deckert in Thin Film Processes (Academic Press, Inc, 1978, p. 401) edited by J. L. Vossen, which is hereby incorporated by reference.

Upper silicon layer 7 is typically about 2000 Å thick and single crystal. Because of the atomically sharp interface formed between upper silicon layer 7 and buried oxide layer 6 only a very small variation in thickness of upper silicon layer 7 exists. The thickness of upper silicon layer 7 depends upon the oxygen implantation energy of oxygen implanted during formation of buried layer 6.

Buffer layer 8 absorbs strain due to lattice constant differences between upper silicon layer 7 and metal oxide film 9. Buffer layer 8 also isolates metal oxide layer 9 when upper silicon layer 7 is dissolved with an etchant. Preferably, buffer layer 8 is oriented yttria stabilized zirconia oriented by its growth upon upper silicon layer 7. If upper silicon layer 7 is oriented (100) then buffer layer 8 will also be oriented (100). Preferably buffer layer 8 is between 100 and 5000 Å, and more preferably about 1000 Å thick.

Metal-oxide layer 9 is grown upon buffer layer S. In a preferred embodiment, metal oxide layer 9 is a superconducting thin film of YBCO, but may also be other metal oxide superconductors, pyroelectrics such as $(BaSr)TiO_3$, and ferroelectrics such as PZT, among others. Free standing films of those materials are useful at least as IR detectors.

The presence of a native surface oxide ($SiO_x$) on upper silicon layer 7 reduces YSZ buffer layer epitaxy in the desired (100) orientation and often leads to formation of YSZ in the undesirable (111) orientation. It is therefore desirable to strip off the native top surface oxide and passivate the surface by hydrogen termination before growing YSZ. Hydrogen termination is described by Fenner et al in Journal of Applied Physics, Volume 66, 419 (1989). The crystalline Si surface is hydrogen terminated if it is immersed in any of the HF reagents such as HF and water or HF and ethanol.

After depositing metal oxide film 9 silicon substrate 5 is chemically dissolved by a selective etchant while protecting metal oxide film 9 from the etchant. Buried oxide 6 acts as an etch stop layer which is not etched by the selective etchant for silicon, preventing buffer layer 8 and metal oxide layer 9 from being exposed to the selective etchant for silicon.

Figure 3:
FIG. 3 shows the thin film of the second embodiment detached from its original substrate.
Figure 4:
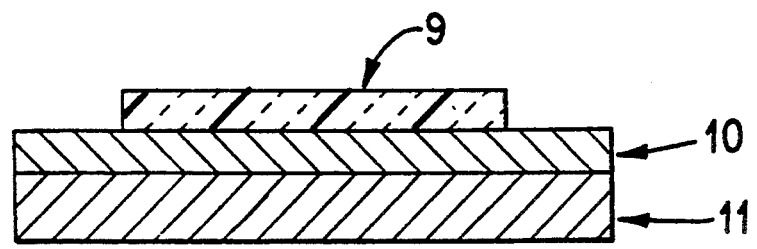
FIG. 4 shows a sectional view of the thin film of the second embodiment in which that film has been attached to a new substrate.

After the substrate is dissolved away a thin free standing structure consisting only of silicon oxide layer 6, silicon layer 7, buffer layer 8, and metal oxide layer 9 remains. That structure has very low thermal mass due to its thinness so that metal-oxide layer 9 is therefore useful in detector applications. The silicon oxide and YSZ layers may also be removed by selective etching and/or ion beam etching, reactive ion etching, or reactive ion beam etching to leave only metal oxide layer 9 as shown in FIG. 3. Metal oxide layer 9, by itself or with any of buffer layer 8, silicon layer 7 and silicon oxide layer 6, may be attached to a new support backing 11 via glue 10 or its equivalent, as shown in FIG. 4. While thin structures of metal-oxide layers have been described other thin layer materials are useful, for example as membranes, and may be deposited instead of metal oxide layer 9.

EXAMPLE 2

The invention was experimentally verified using pulsed laser ablation for the deposition of both the buffer layers 4, as well as the YBCO film S. This deposition method is well known in the deposition of superconducting films and has been described in detail by Singh et al. in "Theoretical model for deposition of superconducting thin films using pulsed laser evaporation technique," Journal of Applied Physics, Volume 68, 1990, pp. 233-246.

In fabricating the sample of Example 2, the vacuum chamber was pumped down to vacuum levels of the order of $10^{-6}$ Torr, before letting the oxygen gas in to the chamber to maintain the required oxygen partial pressure during the deposition. All the three layers were deposited in a single pump-down cycle, without exposing the chamber to the ambient atmosphere between each layer. The targets were held on a carrousel of the sort described by Chase et al. in "Multilayer high $T_c$ film structures fabricated by pulsed laser deposition of Y—Ba—Cu—O", Journal of Materials Research, volume 4, 1989, pp. 1326–1329. During the depositions, the carrousel would rotate the chosen target about the target axis with the laser beam hitting the circumference of the target. Between the depositions, the carrousel itself would rotate about its own axis to place the required target in the laser beam.

For our depositions, a KrF excimer laser delivered optical pulses of 248 nm radiation with pulse widths of 20 ns, pulse energy densities of 1.5 J/cm$^2$ on stoichiometric targets, and pulse repetition rates of 10 Hz.

A (100) Si substrate holder holding a substrate was held at a temperature of 725° C. during deposition of a YBCO film and at a temperature of 750° C. during deposition of a YSZ buffer layer.

The (100) Si substrate having a buried oxide layer was cut to dimensions of 10 mm×10 mm and of 0.25 mm thick. It is commercially available from IBIS Corp.

A YSZ buffer layer was deposited to a thickness of 1000 in an oxygen partial pressure of 1 mTorr at 750° C. and found to be oriented (100). The target for the deposition of the (100) YSZ buffer layer was a single crystal of stoichiometric composition, which is available from Commercial Crystal Labs, Naples, Fla.

The YBCO was deposited to a thickness of about 3000 Å. The target for the laser deposition of the YBCO layer was a pellet of sintered powder of YBCO purchased from Seattle specialty ceramics of Woodinville, Wash.

After the depositions, the film of Example 2 was cooled to room temperature at the rate of 75° C./min in 200 Torr of oxygen.

The superconducting transition temperature of the YBCO film of Example 2 was determined by ac susceptibility and dc resistivity measurements carried out as a function of temperature. The YBCO film exhibited a superconducting transition temperature of 87K with a transition width less than 1K.

The crystalline quality of the film-buffer layer combination of example 2 was determined by x-ray diffraction. The diffraction studies indicated a high degree of crystalline quality with the c-axis of the film 5 the buffer layers 4 and the substrate 1 all parallel to each other, indicating a high degree of epitaxial growth.

The Si substrate is etched away using an oxidation-reduction or "redox" etching process, which involves conversion of the material being etched to a soluble higher oxidation state. Prior to etching, the YBCO film surface is protected with an epoxy resin available from Emerson and Cuming Inc. of Woburn, Mass. This is done by warming the film surface to a temperature of 100° C. and applying a small bead of epoxy to the surface. Two etching media presently used are (i) 33 wt % KOH solution at 70° C., (ii) Ethylenediamine-pyrocatechol-water (EPW) solutions. Those media are used in conjunction with the immersion etching technique whereby a substrate to be etched is immersed in one of those etchants.

The substrate of Example 2 was immersion etched. The masked substrate (masked on the film side) was submerged in a liquid etchant. All the etching procedures were carried out in Teflon beakers since HF attacks glass. The etchant was mechanically agitated since that was found to improve uniformity and control of the etching process. Further, one of the rate limiting steps of the etching process is the evolution of $H_2$ gas bubbles. The Si substrate was etched at 5 gm/min until the substrate was entirely dissolved, leaving a free standing film comprising YBCO.

The free standing YBCO film was then epoxied onto a single crystalline diamond substrate with a thin layer of epoxy (GE 1052). The film with the epoxy and diamond substrate was air dried under a tungsten lamp for 24 hours. The resin protecting the YBCO film was washed away in acetone exposing the YBCO film.

The superconducting film was determined to have a transition temperature above 77K.

Although the invention has been described with reference to YBCO, almost all of the high $T_c$ oxide superconductors have crystal structures similar to that of YBCO and exhibit similar superconducting properties, for example the bismuth and thallium cuprate superconductors and bismuth potassium oxide superconductors. Therefore those materials can be substituted for the YBCO of Example 2. Although pulsed laser deposition was used in Example 2, the invention may be practiced with all other deposition techniques, e.g., magnetron sputtering and e-beam deposition.

Although the invention has been described with reference to superconducting oxides, it is applicable to any epitaxial oxide over-layer such as ferroelectric oxides and photorefractive oxides.

A buried oxide layer provides an atomically flat surface at which etching of a selctive etchant stops. Since the buried oxide interface is atomically flat, very small variations in thickness of the slectively etched free standing structure are obtained. Variations in thickness across a 1 cm by 1 cm sample of less than 500 Å may be achieved. Because buried oxides may be uniformly prepared to have a uniform depth in the substrate across a large wafer, such as a 3 inch diameter wafer, and because the buried oxide provides an atomically sharp etch stop, membranes having an average thickness as thin as 1000 Å may be provided across an entire 3 inch diameter wafer by the process disclosed above.

Although the invention has been described with reference to a Si substrate with a buried oxide, it also is clear to one of ordinary skill to apply to other substrates with a buried oxide. Likewise other buried layers besides oxides may be used so long as they form, upon recrystallization, an atomically sharp interface between the buried layer and the recrystallized single crystal layer 7.

THIRD EMBODIMENT

Figure 5:
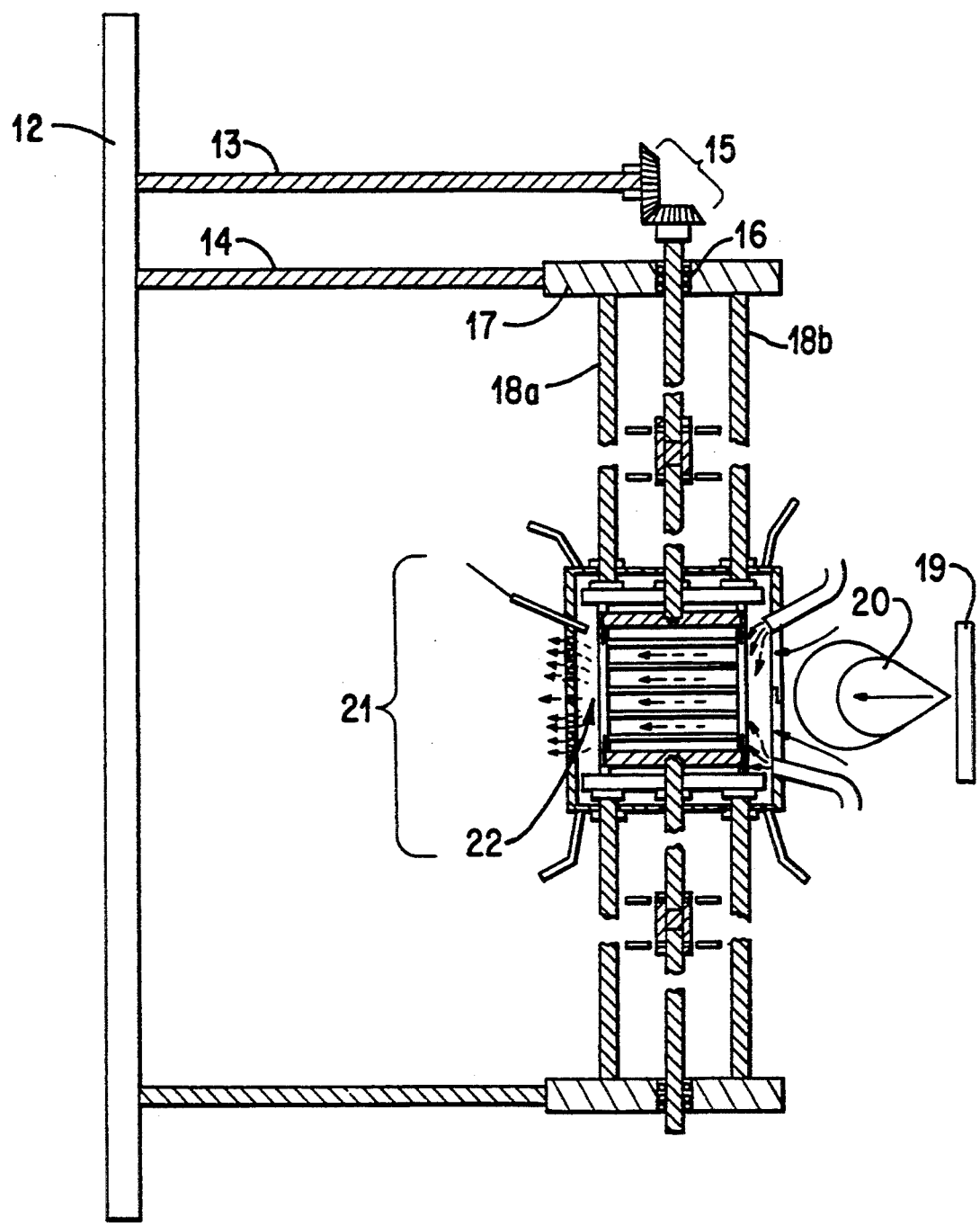
FIG. 5 shows a sectional overview of a third embodiment of the present invention.

A more complete appreciation of the invention and many of the attendant advantages thereof will be readily obtained as the same becomes better understood by reference to the following detailed description of the third embodiment when considered in connection with the accompanying drawings, wherein FIG. 5 shows a cross-section of an overview of a substrate fixture 21 connected via support rods 14 and rotary power feed 13 to flange 12. Substrate fixture 21 is preferably used in a low pressure vessel and flange 12 is used to connect and hold substrate fixture 21 inside that vacuum vessel.

Figure 6:
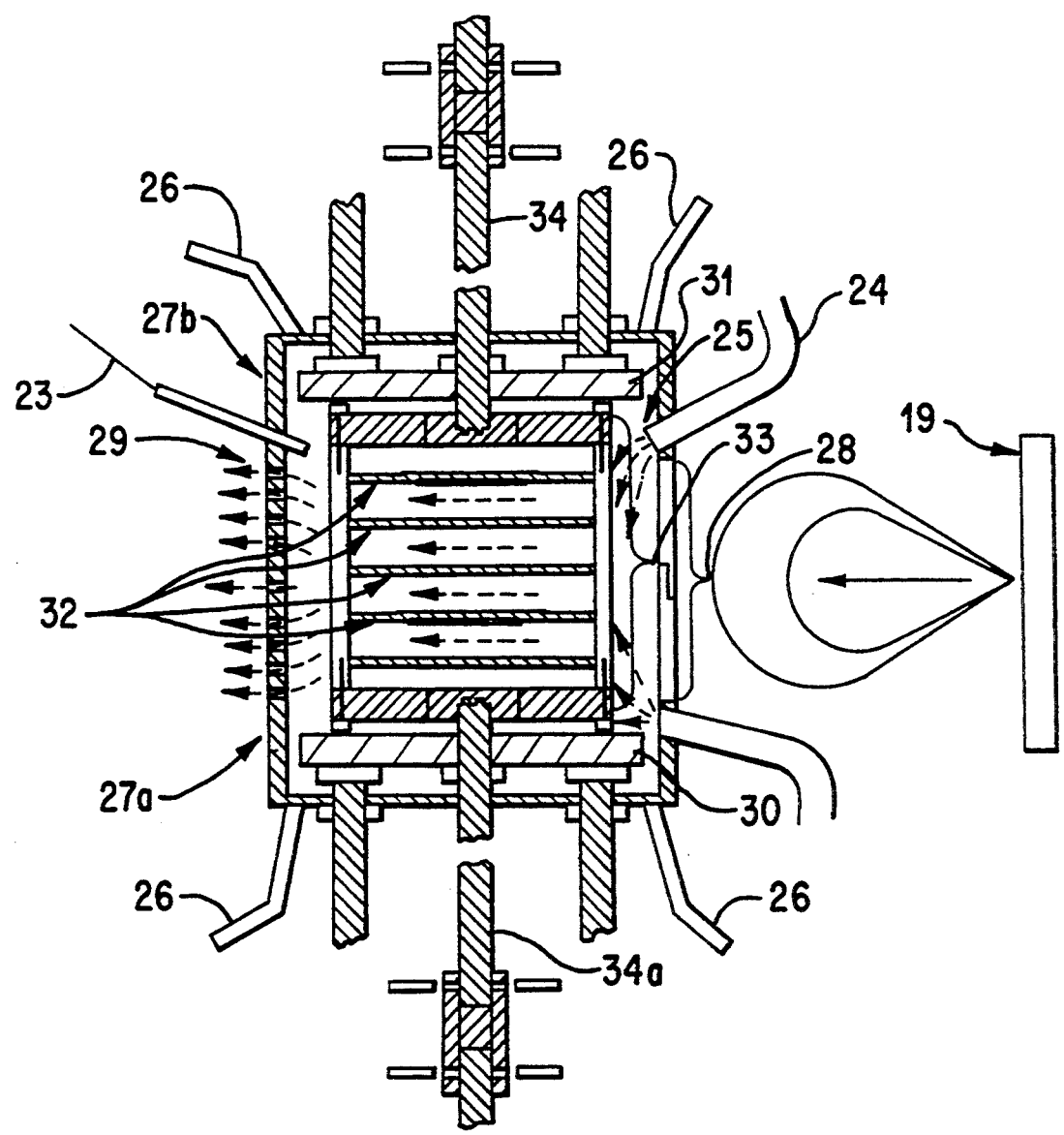
FIG. 6 shows a more detailed sectional view of the third embodiment.

Support rod 14 is coupled via rotary power coupler 15 to rotary shafts 34, 34a as shown in FIG. 6.

Although rotary shafts 34, 34a, are shown to provide power along the axis of the substrate magazine, it is equally possible for rotary shafts 34, 34a to provide rotary power along a peripheral edge of substrate magazine 33.

Rotary shafts 34, 34a are preferably restrained to rotary movement by ball bearings 16 and ball bearing support housing 17 which is connected to flange 12 via support rods 14. Support arms 18a, 18b connect to ball bearing support housing 17 and to substrate fixture 21, thereby holding substrate fixture 21 motionless.

The overview of FIG. 5 also shows the orientation of substrate fixture 21 to a PLD target 19 and plume 20 which is generated when a PLD pulse impinges upon target 19. The arrow shown in plume 20 indicates the average momentum vector of plume 20 which is directed toward substrate fixture 21. Substrate fixture 21 contains substrate magazine 22. Substrate magazine 22 provides means for simultaneously holding a plurality of substrates in substrate fixture 21 and will be discussed in more detail below.

Figure 5A:
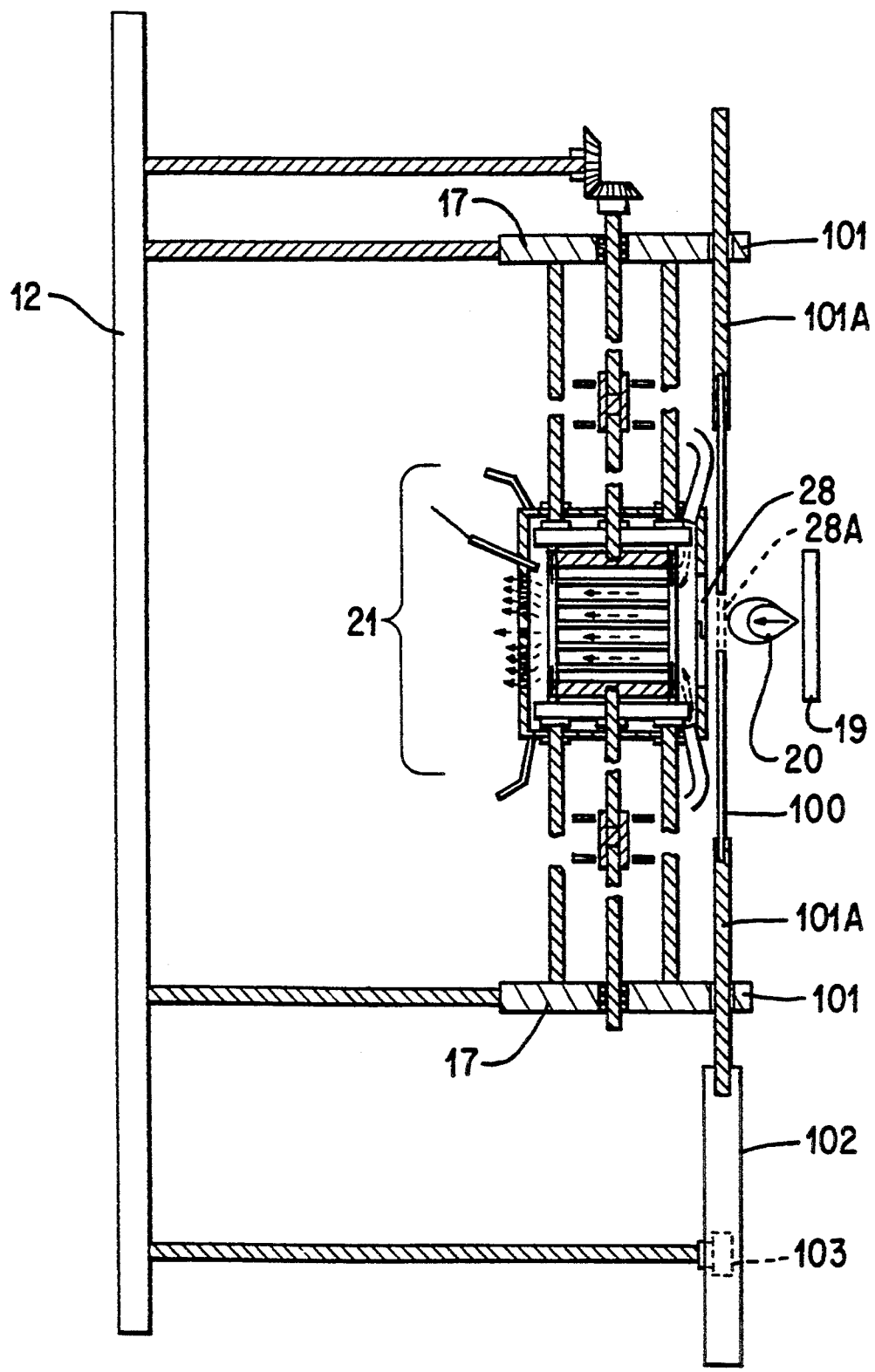
FIG. 5A shows a sectional overview of a variation of the third embodiment of the present invention.
Figure 5B:
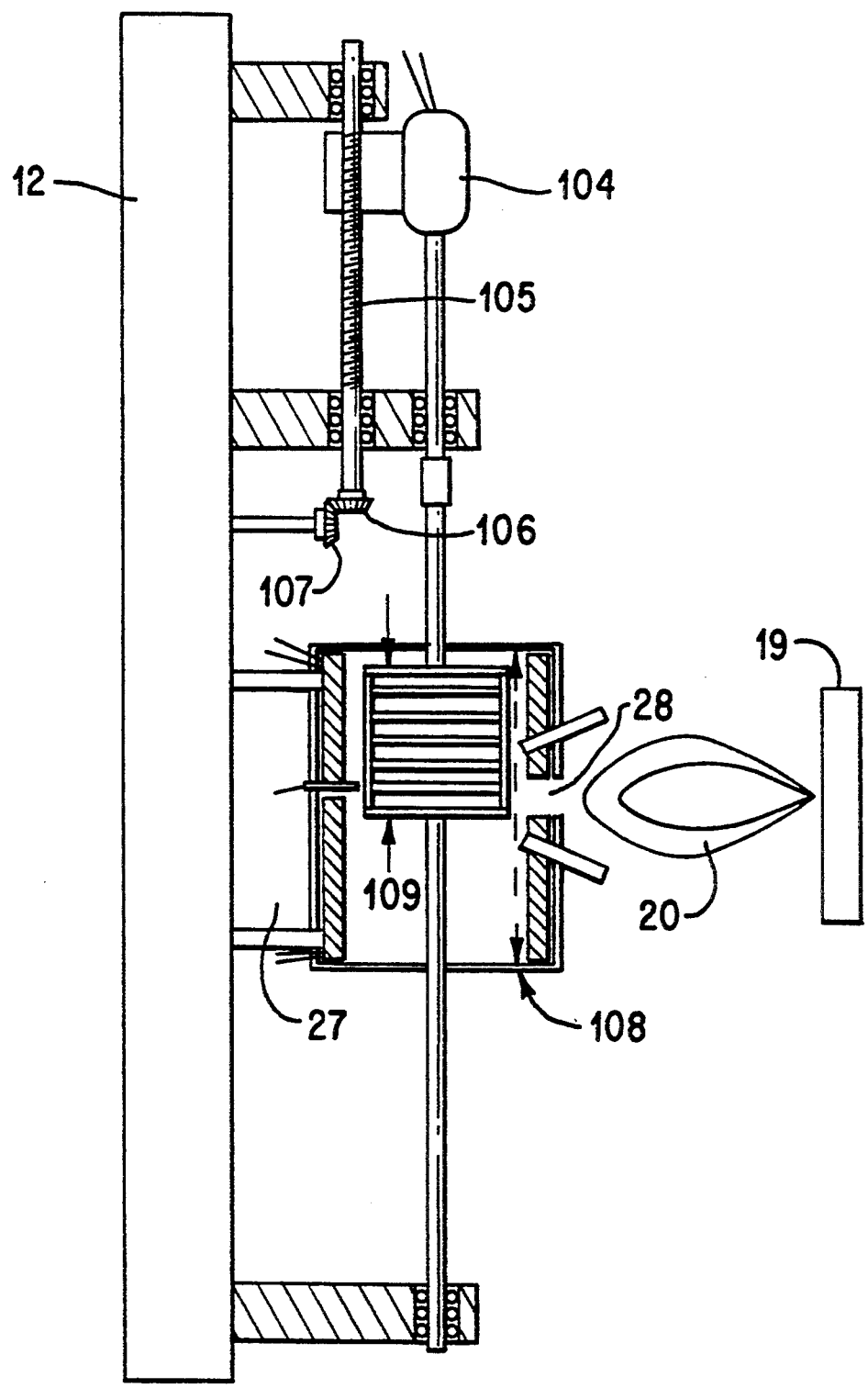
FIG. 5B shows a sectional overview of another variation of the third embodiment of the present invention.

FIGS. 5A and 5B show alternate embodiments of the substrate fixture 21 of FIG. 5 in which laser plume 20 scans along the rotation axes of the substrates in order to provide uniform coating to the subsstrates. FIG. 5A showsextension 101 of ball bearing support housing 17 slidably supporting mask support rods 101A. Mask support rods 101A hold mask 100 between substrate fixture 21 and target 19 so that plume 20 must pass through aperture 28A of mask 100. Motor 103 drives the lower mask support rod 101A via support 102.

During operation of the embodiment of FIG. 5A mask 100 and the point at which the laser beam impinges target 19 are simultaneously scanned along the rotation axes of the substrates in order to uniformly coat the stack of substrates. Mask 100 is narrower than aperture 28 and provides heat shielding in order to maintain uniform temperature to the substrates.

FIG. 5B shows an embodiment where the point of ablation relative to the containment chamber containing the substrate fixture does not vary with time, but the sbustrates inside fixture housing 27 are translated along their axes of rotation to scan them past aperture 28 in order to provide uniform coating to the substrates. Gears 106 and 107 translate rotary power provided by an external motor (not shown) external to the containment chamber into the cahmber and to threaded rod 105. Rotation of threaded rod 105 drives rotary motor 104 along its axes of rotation thereby translating the substrates. Preferably, axial length 108 of the inside of fixture housing 27 is at least twice as long as axial length 109 of substrate magazine 33 so that substrate magazine 33 may be translated to provide uniform coating to all the substrates within it.

FIG. 6 shows a more detailed view of substrate fixture 21 of FIG. 5 which shows thermocouple 23 extending into substrate fixture 21 through fixture housing upper half 27b. Fixture housing upper half 27b interconnects with fixture housing lower half 27a to form an enclosure substantially enclosing substrate magazine 22. Gas lines 24 provide a flow of gas at a pressure above the background pressure in the pressure vessel to substrate fixture 21. More specifically, gas nozzles 24 provide gas to that side of substrate fixture 21 opposing target 19 and gas nozzles 25 are directed so that gas exiting gas nozzle 25 has an average momentum component in the same direction as the net momentum direction of the plume. In other words, the nozzles point generally away from target 19 and enter either fixture housing lower half 27a or fixture housing upper half 27b along the side of the housing facing target 19 and direct gas through substrate fixture 21 toward a side of substrate fixture 21 which is furthest from target 19.

Heater power wires 26 provide power to heater blocks 30, 31. Heater blocks 30, 31 are connected to the stationary support arms 18a, 18b. In a presently preferred embodiment the heated area of each opposing heater block 30, 31 is between 3 and 20 square inches. Radiant energy is contained within the heater assembly by radiation reflecting/shielding (not shown) creating a "blackbody" affect.

The fixture housing consisting of fixture housing lower half 27a and fixture housing upper half 27b includes several openings, including gas escape holes 29 disposed on that side of substrate fixture 21 which is away from target 19 and fixture housing front side opening 28 which is an opening on the side of substrate fixture 21 that faces target 19 and through which material from plume 20 enters into the housing of substrate fixture 21. Gas nozzles 25 may pass through fixture housing front side opening 28 or may pass through additional openings in the substrate fixture housing.

Substrate magazine 33 inside substrate fixture 21 is connected along its vertical axis to rotary shafts 34, 34a. During operation substrate magazine 33 holding substrates 32 is rotated via power supplied by rotary shafts 34, 34a. Substrates 32 have a radius R and preferably are separated by less than R. As discussed below, the separation distance between substrates affects deposition thickness uniformity. Also, as illustrated by Examples 4 and 5 below, when substrates are separated by at least R/4 which is ¼ inch in those examples, material is deposited over the center of a two inch diameter substrate. Examples 4 and 5 indicate that when substrates are separated by at least ¼ inch or R/4 and rotated during deposition an entire 2 inch substrate is coated.

Substrates 32 are held in position in substrate magazine 33 by grooves in rods 39 into which edges of the substrates fit.

Figure 7A:
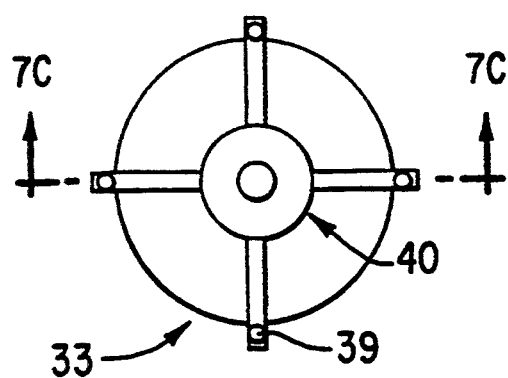
FIGS. 7A–7C show various views of a substrate magazine of the third embodiment.
Figure 7B:
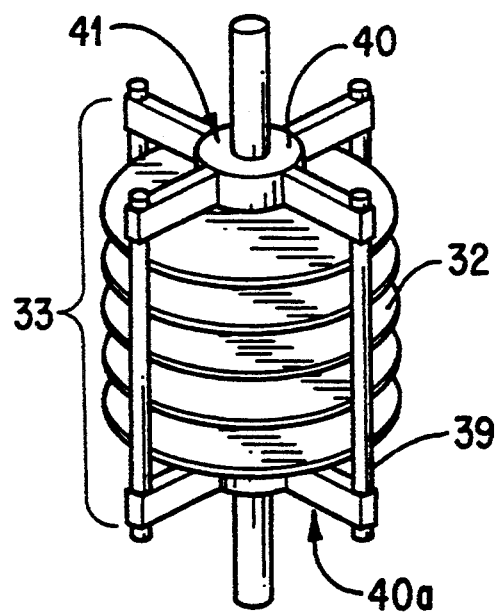
Figure 7C:
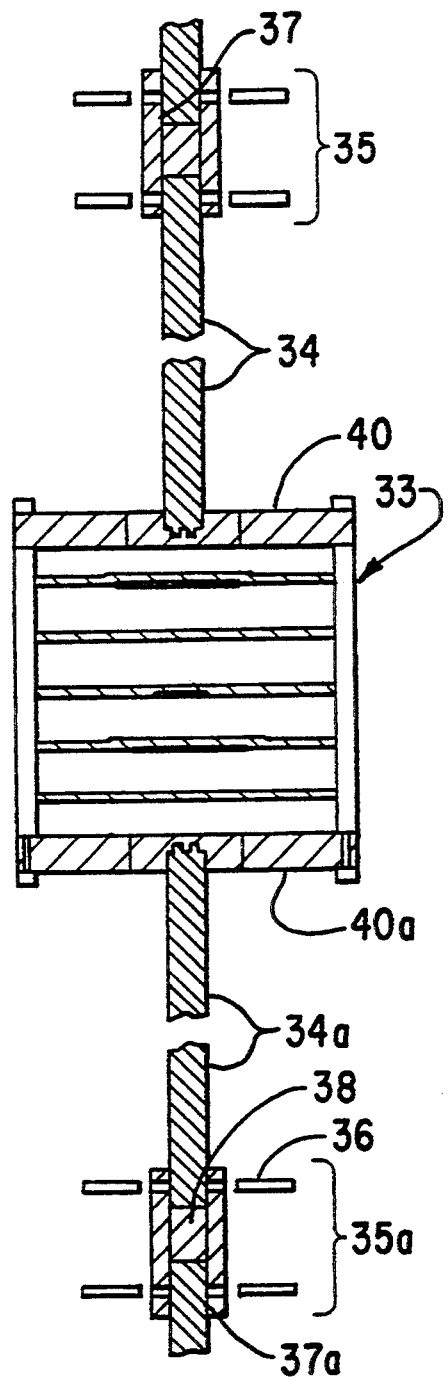

FIGS. 7a-7c show a more detailed view of substrate magazine 32 and how substrate magazine 32 is connectable and detachable from rotary shafts 34, 34a. FIG. 7a shows a plan view of substrate magazine 33 in which four vertical rods 39, also shown in FIG. 7b, hold upper and lower radial supports 40, 40a, at a fixed separation. Upper and lower radial supports 40, 40a are connected to rotary shafts 34, 34a, respectively, as shown in FIG. 7c. Rotary shafts 34, 34a, are vertically translatable so that they may be withdrawn from substrate magazine 33 so that substrate magazine 33 may be horizontally displaced and removed from substrate fixture 21. Rotary shafts 34, 34a, may be vertically displaced by sliding them along sleeves 37, 37a, of translatable rotary shaft connectors 35, 35a. Rotary shafts, 34, 34a, may be secured against further vertical translation by insertion of screws 36 as shown in FIG. 7c.

Substrate fixture 21 is operated by connecting flange 12 to the wall of a vacuum chamber. Substrate magazine 33 is assembled as shown in FIG. 7b with substrates 32 held in position by notches spaced along the length of rods 39. Rods 39 are secured to upper and lower radial supports 40, 40a via screws (not shown). Substrate magazine 33 is then disposed inside substrate fixture 21. Rotary shafts 34, 34a are extended until they connect with substrate fixture 33 and rotary shafts 34, 34a, are then secured in position by screws 36. Next, the vacuum vessel containing substrate fixture 21 is pumped down to a pressure determined useful for PLD. Substrate fixture 21 is heated by supplying power to heater power wires 26 to heater blocks 30, 31 and temperature is monitored and controlled using thermocouple 23. Substrate magazine 22 is rotated by rotary power supplied via rotary shafts 34, 34a and preferably at between 1 and 1000 revolutions per minute. A supply of gas is provided through gas nozzles 25.

It is important to note that gas supplied through gas nozzles 25 is preferably supplied so that a flow of gas is generated from the front side of substrate fixture 21, i.e., the side of substrate fixture 21 facing target 19, along the surfaces of the substrates and toward gas escape holes 29 at the back side of substrate fixture 21 through which the supplied gas escapes from substrate fixture 21. Preferably, chamber pressure is maintained constant through use of a vacuum pumping system (not shown). The flow of supplied gas along the momentum direction of plume 20 is believed to break up an acoustic standing wave pattern generated by supersonic flow of plume 20 through substrate magazine 33. As discussed below, that supersonic flow and the acoustic standing wave pattern set up thereby is believed to cause inhomogeneous thickness of material deposited on substrates 32, and that inhomogeneity is alleviated by flowing gas along the momentum direction of plume 20 momentum.

Once thermocouple 23 indicates an appropriate temperature for deposition and gas flow has been initiated PLD is commenced by impinging target 19 with high fluence laser pulses. Those pulses generate plume 20, a majority of which passes through fixture housing front side opening 28, travelling roughly parallel to the planes defined by substrates 32.

Substrate fixture 21 is aligned so that substrates 32 have their major surfaces perpendicular to the normal for target surface 19. That alignment is preferably within $\pm 30°$ and more Preferably within $\pm 10°$ for each of the substrates in order to provide adequate coating of both sides of substrates 32 and to avoid deposition of submicron size particles ejected from the surface of target 19 during ablation, which are carried along with the plume into substrate fixture 21, onto substrates 32.

Alternatively, if deposition onto only a single substrate side is desired, planes defined by the substrate surfaces may be canted at an angle relative to the target surface normal thereby preferentially exposing one side of each substrate to the plume, but still enabling multiple substrates 32 to be simultaneously coated. After a desired number of PLD laser pulses, deposition is discontinued, substrates 32 are cooled and eventually removed from substrate fixture 21 and from substrate magazine 33.

Preferably, substrates 32 are spaced very close together in order to provide as many substrates as possible so that an angle between the substrate normal and vertical displacement from the substrate normal to the center of any of substrates 32 and magazine 33 is less than 30°. Typically target 19 is within 12 inches and more preferably within 6 inches of substrate fixture 21. Opening 28 preferably is no larger than necessary to allow that part of the plume which is within $\pm 30°$ of the plane defined by the target surface normal and the substrate surfaces to enter substrate fixture 21. Therefore a relationship exists between opening 28 and the distance from target 19 to the front side of substrate fixture 21 limiting the total width of opening 28 perpendicular to the substrate surfaces.

In any case it is preferable to provide as many substrates at one time as possible in substrate fixture 21. Therefore, it is preferable to provide those substrates with a separation of less than 5 mm between them and more preferably with a separation of less than 2 mm between them. Preferably, substrate magazine 33 can hold at least three substrates at one time and more preferably at least seven substrates at one time. Increasing the number of substrates increases the yield per PLD deposition and also increases the deposition uniformity for central substrates, because substrates at the upper and lower ends of a stack in substrate magazine 33 have their outer sides directly exposed to substrate heater blocks 31, 32. Substrate magazine 33 holds substrates generally parallel to one another, i.e., within a few degrees from parallel.

Figure 8A:
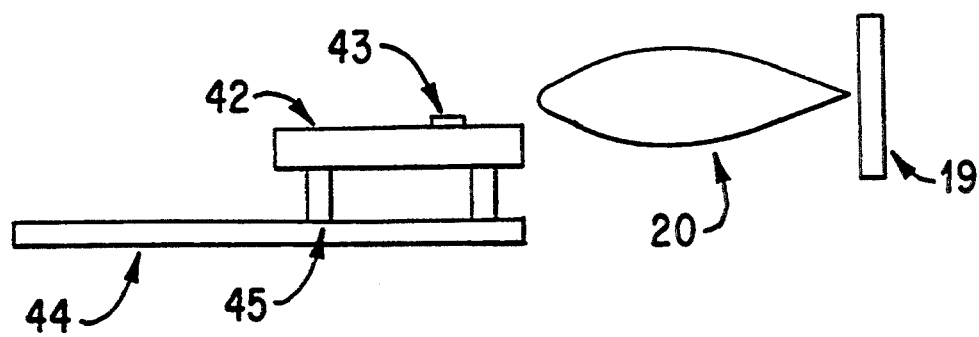
FIGS. 8A–8C show test fixtures and substrate data for examples 8A–8C, respectively.
Figure 8B:
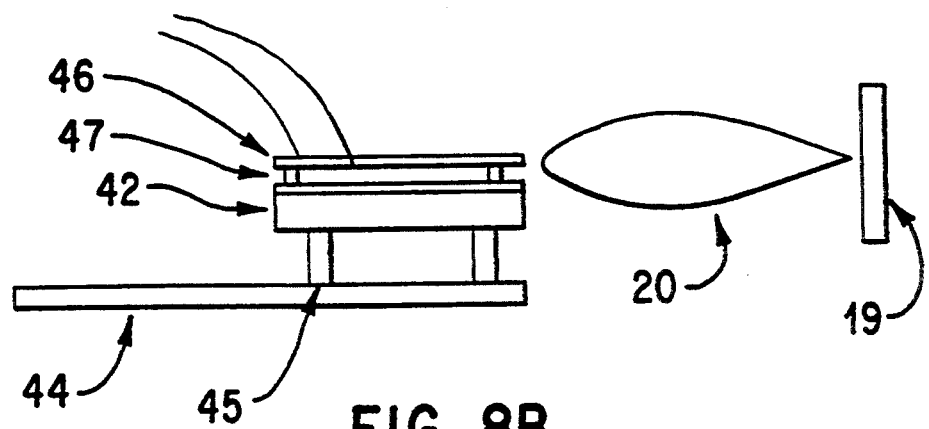
Figure 8C:
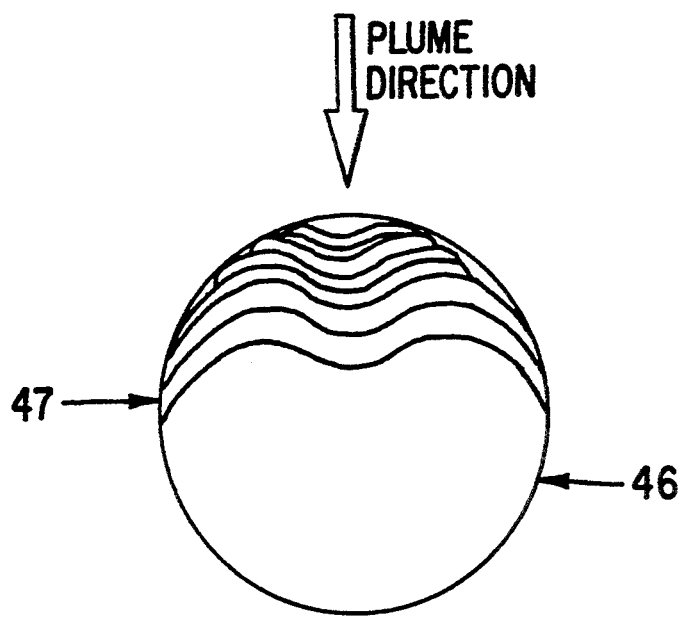

Experimental Examples 3-5 which are discussed with reference to FIGS. 8a-8c are provided below.

EXAMPLE 3

FIG. 8a shows substrate 43 on flat plate heater 42. Flat plate heater 42 is thermally isolated from support rod 44 by ceramic standoffs 45. Substrate 43 has its major surface aligned with a normal from the surface of target 19 so that plume 2b has its momentum direction in the plane of the major surface of substrate 43. Using the configuration shown in FIG. 8a substrate 43 was coated by PLD from target 19. Target 19 was YBCO and substrate 43 was LaAlO$_3$. Deposition rate onto substrate 43 shown in FIG. 8a was found to be within 30% of the deposition rate that occurs when the surface of a substrate to be coated faces plume 20. However, no submicron particles were found to exist in the coating prepared on substrate 43. The coating on substrate 43 was found to have superconducting properties similar to properties for films prepared when a major surface of a substrate is oriented to face plume 20.

EXAMPLE 4

FIG. 8b shows the configuration for Example 4 in which substrates 46 were separated by spacer 47 from one another and heated by flat plate heater 42. Flat plate heater 42 was thermally isolated from support rods 44 by ceramic standoffs 45. Thickness of substrates 46 ranged between 0.001 and 0.050 inches. Again, plume 20 had a momentum direction in the plane of the major surfaces of substrates 46. The substrates were 2 inch diameter silicon wafers.

In Example 4, substrates 46 were separated by 0.125 inches by spacers 47.

FIG. 8c shows one of the opposing sides of one of the substrates 46 in which the momentum direction of the plume is indicated. That substrate shows a pattern indicating thickness ridges 47. Between each two lines shown on the substrate 46 in FIG. 8c is a region of constant thickness. Several separate regions are shown. Those regions do not quite encompass the center of substrate 46.

EXAMPLE 5

The same configuration as shown in Example 4 was used, the only difference being that spacers 47 separated substrates 46 by 0.25 inches. In Example 5 thickness ridges similar to thickness ridges 47 shown in FIG. 8c occurred, but those ridges extended to encompass the center of substrate 46. In both Examples 4 and 5 target 19 was between 2 and 5 inches from the closest portion of the substrates.

The ridges shown in FIG. 8c are due to constrained flow dynamics occurring in the cavity defined by the two opposing faces of the substrates. That constrained flow dynamics sets up static pressure waves between the substrates that result in regions of deposited film of different thickness. Flowing gas along the surface of the substrates in a direction along which the plume travels removes the standing wave pattern resulting in a more uniform deposition. Additionally, rotation of the substrates during deposition circularly homogenizes the ridges 47 shown in FIG. 8c.

Obviously numerous modifications and variations of the present invention are possible in light of the above teachings. It is therefore to be understood that within the scope of the appended claims, the inventions may be practiced otherwise than as specifically described herein.

What is claimed as new and desired to be secured by Letters Patent of the United States is:

1. A superconducting device, comprising:
    a substrate having a lower surface and comprising $MF_2$ and having an $MF_2$ surface that is above the substrate lower surface where M is selected from a member of the group consisting of Be, Mg, Ca, Sr and Ba;
    a first isolation buffer layer comprising MgO that is disposed on and in epitaxial contact with the substrate $MF_2$ surface;
    a second isolation and lattice matching buffer layer disposed on and in contact with the first buffer layer where said second isolation and lattice matching buffer layer is a perovskite crystal structure material and is selected from a member of the group consisting of $NdGaO_3$ and $SrTiO_3$; and
    a superconducting metal-oxide layer disposed on and in epitaxial contact with the second buffer layer where said superconducting metal-oxide layer is selected from a member of the group consisting of $Y_1Ba_2Cu_3O_{7-x}$ where x is equal to or greater than zero and is less than or equal to one-half, TlBaCaCuO and BiSrCaCuO.

2. A superconducting device according to claim 1 wherein:
    M consists essentially of Mg.

3. A superconducting device according to claim 1 wherein:
    the $MF_2$ substrate comprises a single crystal of $MF_2$.

4. A superconducting device according to claim 1 wherein:
    the first isolation buffer layer has a thickness that is between 30 angstroms and one micron.

5. The superconducting device according to claim 1 wherein the second isolation and lattice matching buffer layer is in epitaxial contact with the first isolation buffer layer.

6. The superconducting device according to claim 1 further comprising a third buffer layer between the first and second buffer layers, wherein the third buffer layer is in epitaxial contact with the first and second buffer layers.

7. A superconducting device, comprising:
    a substrate having a lower surface and comprising $MF_2$ and having an $MF_2$ surface that is above the substrate lower surface where M is selected from a member of the group consisting of Be, Mg, Ca, Sr and Ba;
    a first isolation buffer layer comprising MgO that is disposed on and in epitaxial contact with the substrate $MF_2$ surface;
    a second isolation and lattice matching buffer layer disposed on and in contact with the first buffer layer where said second isolation and lattice matching buffer layer is selected from a member of the group consisting of $CeO_2$, yttria stabilized zirconia, $NdCaAlO_4$, $LaSrAlO_4$, and $LaSrGaO_4$; and
    a superconducting metal-oxide layer disposed on and in epitaxial contact with the second buffer layer where said superconducting metal-oxide layer is selected from a member of the group consisting of $Y_1Ba_2Cu_3O_{7-x}$ where x is equal to or greater than zero and is less than or equal to one-half, TlBaCaCuO, and BiSrCaCuO.

8. The superconducting device as recited in claim 7 where M consists essentially of Mg.

9. The superconducting device as recited in claim 7 wherein:
    the $MF_2$ substrate comprises a single crystal of $MF_2$.

10. The superconducting device as recited in claim 7 wherein:
    the first isolation buffer layer has a thickness that is between 30 angstroms and one micron.

11. The superconducting device as recited in claim 7 wherein the second isolation and lattice matching buffer layer is in epitaxial contact with the first isolation buffer layer.

12. The superconducting device as recited in claim 7 further comprising a third buffer layer between the first and second buffer layers, wherein the third buffer layer is in epitaxial contact with the first and second buffer layers.

* * * * *